United States Patent
Hsieh

(10) Patent No.: US 8,278,189 B2
(45) Date of Patent: Oct. 2, 2012

(54) METHOD FOR THINNING WAFER

(75) Inventor: Cheng-Yu Hsieh, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 139 days.

(21) Appl. No.: 12/874,231

(22) Filed: Sep. 2, 2010

(65) Prior Publication Data
US 2012/0058623 A1    Mar. 8, 2012

(51) Int. Cl.
*H01L 21/46* (2006.01)
*H01L 21/30* (2006.01)
*H01L 21/762* (2006.01)

(52) U.S. Cl. ............... 438/459; 430/455; 257/E21.568; 257/E21.569; 257/E21.57

(58) Field of Classification Search .............. 438/455, 438/459; 257/E21.568, E21.569, E21.57
See application file for complete search history.

(56) References Cited

U.S. PATENT DOCUMENTS

| | | | |
|---|---|---|---|
| 5,863,829 A * | 1/1999 | Nakayoshi et al. | 438/459 |
| 6,376,797 B1 | 4/2002 | Piwczyk | |
| 6,583,029 B2 * | 6/2003 | Abe et al. | 438/455 |
| 6,641,464 B1 | 11/2003 | Steere | |
| 7,129,172 B2 | 10/2006 | Morrow | |
| 7,186,629 B2 * | 3/2007 | Wesselmann et al. | 438/460 |
| 7,238,915 B2 | 7/2007 | Grek | |
| 8,119,500 B2 * | 2/2012 | Yang et al. | 438/459 |
| 2005/0064681 A1 * | 3/2005 | Wood et al. | 438/459 |
| 2006/0219351 A1 * | 10/2006 | Kuan et al. | 156/247 |
| 2007/0108557 A1 | 5/2007 | Park | |
| 2008/0044984 A1 | 2/2008 | Hsieh | |

* cited by examiner

*Primary Examiner* — Luan C Thai
(74) *Attorney, Agent, or Firm* — Winston Hsu; Scott Margo

(57) ABSTRACT

The present invention provides a method of thinning a wafer. First, a wafer is provided. The wafer includes an active surface, a back surface and a side surface. The active surface is disposed opposite to the back surface. The side surface is disposed between the active surface and the back surface and encompasses the peripheral of the wafer. Next, a protective structure is formed on the wafer to at least completely cover the side surface. Last, a thinning process is performed upon the wafer from the back surface.

20 Claims, 6 Drawing Sheets

METHOD FOR THINNING WAFER

BACKGROUND OF THE INVENTION

1. Field of the Invention

The present invention relates to a method for thinning a wafer, more particularly, to a method that can reduce the chipping problem during the thinning process.

2. Description of the Prior Art

In the recent years, various electronic products are aiming at becoming light, thin and small, so the manufacturers are devoting themselves to developing new processing technologies in order to increase the integrity of electronic products, for example, a "wafer thinning" technology. The wafer thinning technology is widely used in various kinds of fields, such as the back side illuminated (BSI) photo-sensor developed in the recent years. As the light in the BSI photo-sensor is collected from the back side of the pixel area, the light is not shielded by the front circuit and effective pixel areas can be increased. Consequently, the problem of noise interference can be avoided in conventional front side illuminated photo-sensors. In addition, the wafer thinning technology can also be used in chip packaging. Since the wafer can be thinner after the thinning process, the package size can become smaller.

However, there are still a lot of problems to overcome in conventional wafer thinning processes, such as the chipping problem. As the semiconductor wafer is usually made of silicon, silicon germanium or gallium arsenide, the flexibility of the wafer is poor. When the wafer is thinned to a thickness less than 300 mm, the problem of wafer chipping or breaking easily occurs during the thinning process. Please refer to FIG. 1, illustrating a schematic diagram of the wafer chipping during the wafer thinning process in conventional arts. As shown in FIG. 1, when a thinning process is performed by a wafer thinning equipment 102 upon a wafer 100, the stress applied onto the center of the wafer 100 is different from that applied onto the edge of the wafer 100 because there is a bevel 103 with a less thickness near the edge of the wafer 100. Accordingly, a chipping 104 is produced near the bevel 103 during the thinning process.

To solve this problem, a step structure 106 is provided near the edge of the wafer 100 in conventional arts. Please refer to FIG. 2 and FIG. 3, illustrating schematic diagrams of forming the step structure near the edge of the wafer in conventional arts. As shown in FIG. 2, in order to avoid chipping 104 near the edge of the wafer 100, a step structure 106 is provided near the edge of the wafer 100 in conventional arts. And, as shown in FIG. 3, during the thinning process, the step structure 106 can reduce the phenomenon of uneven stress so as to prevent the wafer 100 from chipping. Conventional methods of forming the step structure 106 include using grinding wheel or using lithography technology. However, using grinding wheel to form the step structure 106 still has a risk of producing chipping 104 and it requires additional cutting tools. Using the lithography technology requires additional mask and etching steps, which will increase manufacturing costs.

SUMMARY OF THE INVENTION

The present invention therefore provides a method for thinning a wafer which can prevent the chipping problem and can be performed without forming the step structure.

The present invention provides a method for thinning a wafer. First, a wafer is provided. The wafer includes an active surface, a back surface and a side surface. The active surface is disposed opposite to the back surface. The side surface is disposed between the active surface and the back surface and encompasses the peripheral of the wafer. Next, a protective structure is formed on the wafer to at least completely cover the side surface. Last, a thinning process is performed upon the wafer from the back surface.

In the present invention, the protective structure is formed on the side surface of the wafer before the thinning process. Consequently, a structure with uniform thickness formed by the wafer and the protective structure can be provided and the chipping problem can be alleviated. Compared with the step structure required in conventional arts, the present invention does not need to change the profile of the wafer, and can effectively alleviate the chipping problem and reduce production costs.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
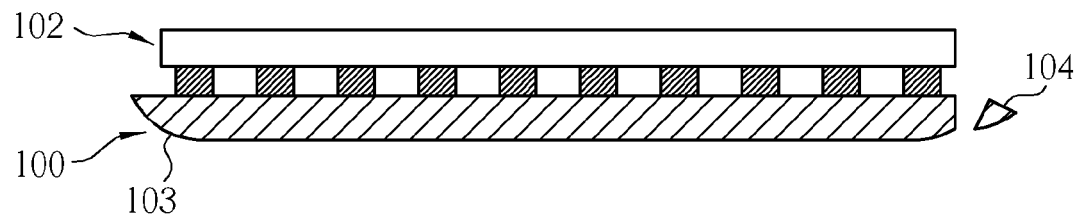
FIG. 1 illustrates a schematic diagram of the wafer chipping during the wafer thinning process in conventional arts.
Figure 2:
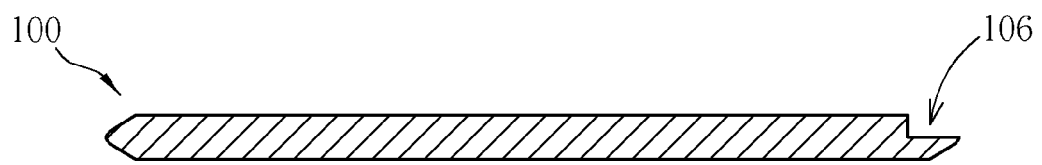
FIG. 2 and FIG. 3 illustrate schematic diagrams of forming the step structure near the edge of the wafer in conventional arts.
Figure 3:
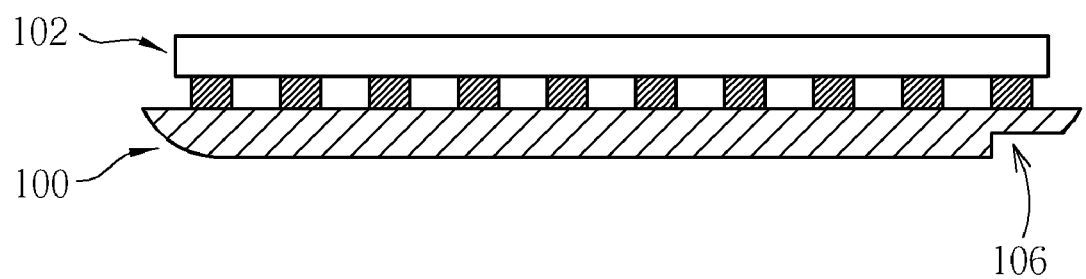
Figure 4:
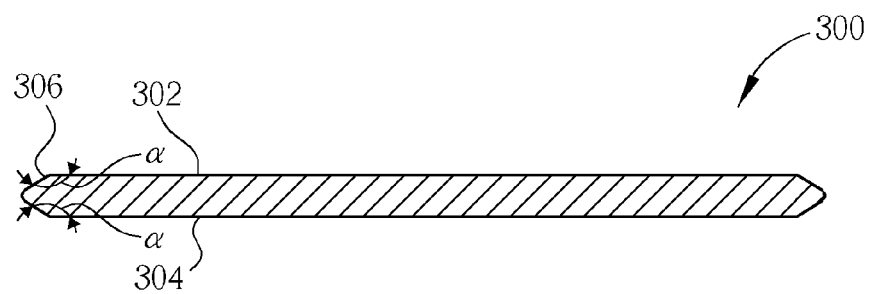
FIG. 4 to FIG. 6 illustrate schematic diagrams of the method for thinning a wafer according to the first embodiment in the present invention.
Figure 5:
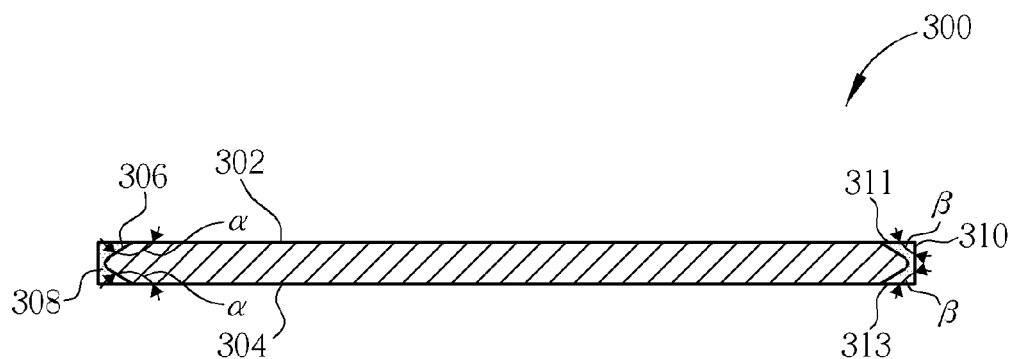
Figure 6:
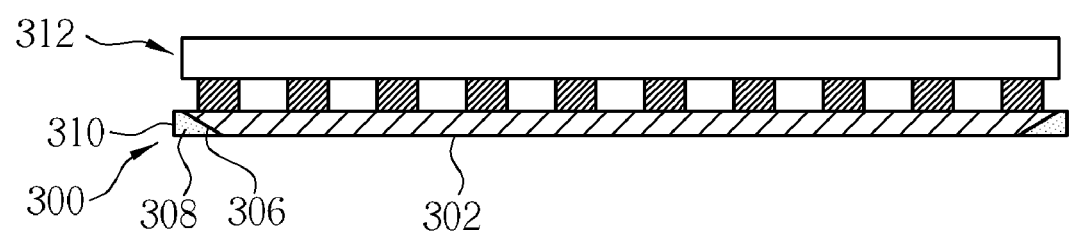

Please refer to FIG. 4 to FIG. 6, illustrating schematic diagrams of the method for thinning a wafer according to the first embodiment in the present invention. First, as shown in FIG. 4, a wafer 300 is provided. The wafer 300 includes an active surface 302, a back surface 304 and a side surface 306. A plurality of semiconductor structures (not shown) are disposed on the active surface 302, such as metal oxide semiconductors (MOS), complementary metal oxide semiconductors (CMOS), photo diodes, metal interconnections, bonding pads, or micro-electrical-mechanical-systems (MEMS), but should not be limited thereto. The back surface 304 is disposed opposite to the active surface 302 and is disposed on the other side of the wafer 300 relative to the active surface 302. The side surface 306 encompasses the peripheral of the wafer 300. The side surface 306 is disposed between the active surface 302 and the back surface 304 and is adjacent to the active surface 302 and the back surface 304, respectively. In one preferred embodiment of the present invention, the wafer 300 is symmetrical along the vertical direction. The side surface 306 and the active surface 302 include a first angle $\alpha$, while the side surface 306 and the back surface 304 also include the first angle $\alpha$. The first angle $\alpha$ is greater than 90 degrees, for example, 135 degrees, making the side surface 306 include a bevel structure extending outwardly between the active surface 302 and the back surface 304.

In order to avoid the chipping problem when the wafer 300 is subjected to the thinning process in conventional arts, a protective structure 308 is formed on the side surface 306 of the wafer 300 before the thinning process. As shown in FIG. 5, the protective structure 308 is formed on the side surface 306 of the wafer 300. In one embodiment, the protective structure 308 completely covers the side surface 306. The protective structure 308 includes a protective side surface 306 disposed correspondingly to the side surface 306, a protective front surface 311 disposed correspondingly and parallel to the active surface 302, and a protective back surface 313 disposed correspondingly and parallel to the back surface 304. The protective side surface 310 and the protective front surface 311 (also the active surface 302, as shown in FIG. 5) include a second angle $\beta$. The protective side surface 310 and the protective back surface 313 (also the back surface 304) also include the second angle $\beta$. In one embodiment, the first angle $\alpha$ is greater than the second angle $\beta$. Preferably, the second angle $\beta$ is substantially equal to 90 degrees. Accordingly, the wafer 300 and the protective structure 308 can be combined to form a structure with substantially uniform thickness.

In one preferred embodiment of the present invention, the protective structure 308 can be formed, for example, by supplying an epoxy resin upon the side surface 306 of the wafer 300 by a spin coating process. Subsequently, depending on the different material property, a solidifying process can be performed to cure the resin to form the protective structure 308, for example, by using a thermal treatment or a radiance treatment with light energy. The material of the protective structure 308 in the present invention is not limited to resin, but can be other materials that can be cured after a solidifying process. It is noted that, a plurality of particles can be selectively added into the resin in order to increase the hardness of the protective structure 308 to improve its protective ability toward the wafer 300. The particles can include, for example, aluminum oxide particles, aluminum nitride particles, silicon oxide particles or silicon nitride particles, but should not be limited thereto. It is understood that other suitable materials whose hardness is greater than that of the resin can be used for the particles.

Lastly, as shown in FIG. 6, a thinning process is performed upon the wafer 300. For example, a thinning equipment 312 is utilized to thin the wafer 300 from the back surface 304. Since the side surface 306 of the wafer 300 is covered and protected by the protective structure 308, a structure with a substantially uniform thickness is formed and sufficient supporting force toward the wafer 300 can be provided during the thinning process. Therefore, the chipping problem near the side surface 306 of the wafer 300 in conventional arts can be alleviated. After the thinning process, the protective structure 308 may be removed, for example, by using a solvent or other method to remove the protective structure 308 thoroughly or partially. In another embodiment, the protective structure 308 can be retained without affecting the subsequent steps after the thinning process, and the follow-up steps such as the die cutting process can be continued.

Figure 7:
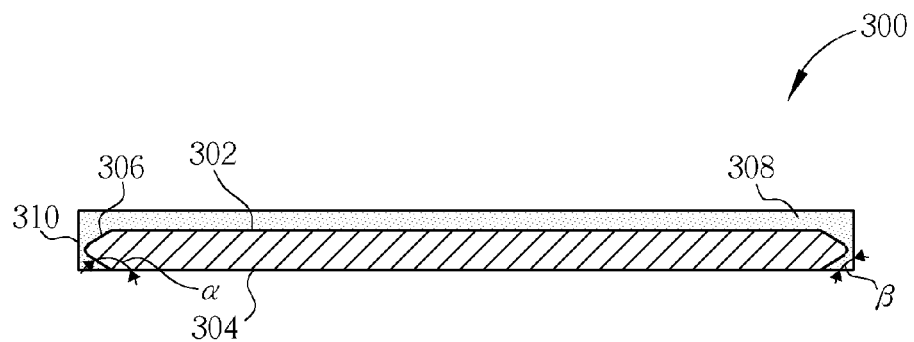
FIG. 7 illustrates a schematic diagram of the method for thinning the wafer according to another embodiment of present invention.

Please refer to FIG. 7, illustrating a schematic diagram of the method for thinning the wafer according to another embodiment of present invention. In the present embodiment, the protective structure 308 is not limited to be formed on the side surface 306 of the wafer 300, but can be formed on the active surface 302 or on the back surface 304 of the wafer 300. As shown in FIG. 7, the protective structure 308 in the present embodiment is formed on the side surface 306 and the active surface 310, and covers the side surface 306 and the active surface 310. The protective structure 308 on the side surface 306 and the protective structure 308 on the active surface 302 can be formed simultaneously or separately. The protective structure 308 on the active surface 302 in the present embodiment can provide appropriate protection to the semiconductor structures on the active surface 302. In another embodiment, the active surface 302 is covered by the protective structure 308 completely or partially, depending on the configuration of the semiconductor structures on the active surface 302. In another embodiment, the protective structure 308 can also be formed on the entire back surface 304 or a part of the back surface 304, depending on the requirements of the thinning process. In still another embodiment, the protective structure 308 can be formed on the side surface 306, the active area 302 and the back surface 304.

Figure 8:
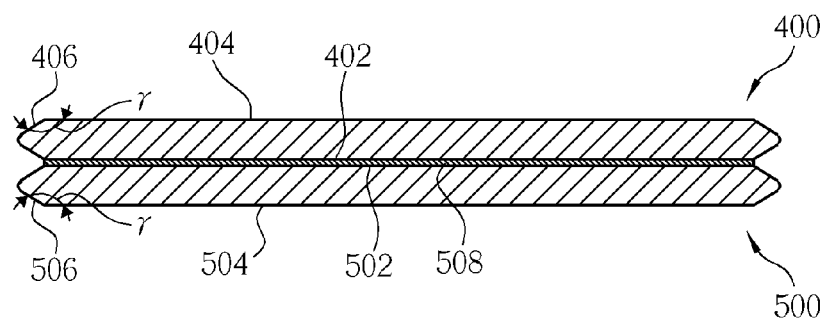
FIG. 8 to FIG. 10 illustrate schematic diagrams of the method for thinning a wafer according to the second embodiment in the present invention.
Figure 9:
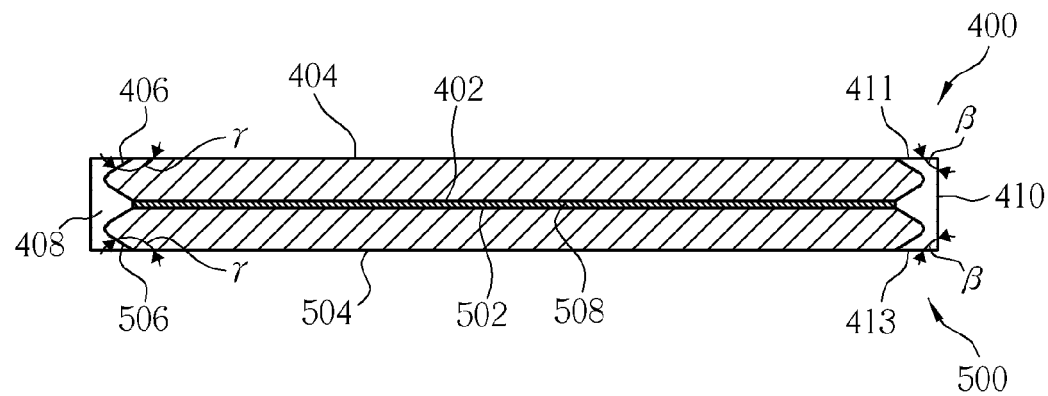
Figure 10:
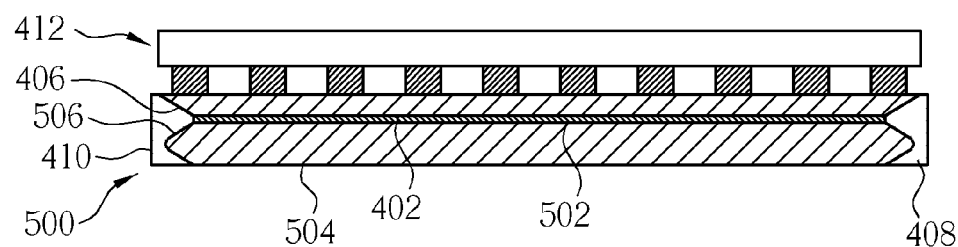

Please refer to FIG. 8 to FIG. 10, illustrating schematic diagrams of the method for thinning the wafer according to the second embodiment of the present invention. As shown in FIG. 8, a wafer 400 and a carrier 500 are provided. The wafer 400 includes an active surface 402, a back surface 404 and a side surface 406. A plurality of semiconductor structures (not shown) are disposed on the active surface 402, such as metal oxide semiconductors, complementary metal oxide semiconductors, photo diodes, metal interconnections, bonding pads, or micro-electrical-mechanical-systems, but should not be limited thereto. The back surface 404 is disposed opposite to the active surface 402 and is disposed on the other side of the wafer 400 relative to the active surface 402. The side surface 406 encompasses the peripheral of the wafer 400. The side surface 406 is disposed between the active surface 402 and the back surface 404 and is adjacent to the active surface 402 and the back surface 404, respectively. The carrier 500 can provide supporting effort to the wafer 400 when the wafer 400 is subjected to the thinning process. In one preferred embodiment, the carrier 500 is another wafer, such as a raw wafer which has similar structure and size to the wafer 400. For example, the carrier 500 includes a carrier front surface 502, a carrier back surface 504 and a carrier side surface 506. The carrier front surface 502 is disposed opposite to the carrier back surface 504. The carrier side surface 506 encompasses the peripheral of the carrier 500. The carrier side surface 506 is disposed between the carrier front surface 502 and the carrier back surface 504 and is adjacent to carrier front surface 502 and the carrier back surface 504, respectively. The carrier front surface 502 is attached to the active surface 402 of the wafer 400, for example, by using an adhesion layer 508 to fix the wafer 400 onto the carrier 500. In one embodiment of the present invention, the side surface 406 and the back surface 404 of the wafer 400 include a third angle $\gamma$. The carrier side surface 506 and the carrier back surface 504 also include the third angle $\gamma$. The third angle $\gamma$ is greater than 90 degrees.

Next, a protective structure 408 is formed on the side surface 406 of the wafer 400 and at least covers the side surface 406. In one preferred embodiment, as shown in FIG. 9, the protective structure 408 is formed on the side surface 406 of the wafer 400 and the carrier side surface 506. The protective structure 408 includes a protective side surface 406 disposed correspondingly to the side surface 406 and the carrier side surface 506, a protective front surface 411 disposed correspondingly and parallel to the back surface 404, and a protective back surface 413 disposed correspondingly and parallel to the carrier back surface 504. The protective side surface 410 and the protective front surface 411 (also the back surface 404, as shown in FIG. 9) include a fourth angle $\delta$. The protective side surface 410 and the protective back surface 413 (also the carrier back surface 504) include the fourth angle $\delta$. In one embodiment, the third angle $\gamma$ is greater than the fourth angle $\delta$. Preferably, the fourth angle $\delta$ is substantially equal to 90 degrees. In another embodiment, the protective structure 408 is not limited to be formed on the side surface 406 and the carrier side surface 508, but can be selectively formed on the back surface 404 or the carrier back surface 504, depending on various demands.

Subsequently, as shown in FIG. 10, a thinning process is performed upon the wafer 400. For example, a thinning equipment 412 is utilized to thin the wafer 400 from the back surface 404. After performing the thinning process, the carrier 500 and the protective structure 408 can be removed thoroughly or partially.

In summary, the protective structure in the present invention is formed on the side surface of the wafer before the thinning process. Consequently, a structure with uniform thickness formed by the wafer and the protective structure can be provided and the chipping problem can be alleviated. Compared with the step structure required in conventional arts, the present invention does not need to change the profile of the wafer, and can effectively alleviate the chipping problem and reduce production costs.

Those skilled in the art will readily observe that numerous modifications and alterations of the device and method may be made while retaining the teachings of the invention.

What is claimed is:

1. A method for thinning a wafer, comprising:
   providing a wafer comprising an active surface, a back surface disposed opposite to the active surface, and a side surface disposed between and directly adjacent to the active surface and the back surface, wherein the side surface encompasses the peripheral of the wafer;
   forming a protective structure on the wafer, wherein the protective structure at least completely covers and directly contacts the side surface;
   performing a thinning process upon the wafer from the back surface; and
   completely removing the protective structure.

2. The method for thinning a wafer of claim 1, wherein the protective structure only covers the side surface of the wafer.

3. The method for thinning a wafer of claim 1, wherein the protective structure further covers the active surface of the wafer.

4. The method for thinning a wafer of claim 1, wherein the protective structure further covers the back surface of the wafer.

5. The method for thinning a wafer of claim 1, wherein the protective structure comprise a protective side surface and a protective front surface, wherein the protective side surface is corresponding to the side surface, the protective front surface is corresponding and substantially parallel to the active surface.

6. The method for thinning a wafer of claim 5, wherein a first angle is disposed between the active surface and the side surface, a second angle is disposed between the protective front surface and the protective side surface, wherein the first angle is greater than the second angle.

7. The method for thinning a wafer of claim 6, wherein the second angle is substantially 90 degrees.

8. The method for thinning a wafer of claim 1, wherein during the thinning process, there is no step structure between the active surface and the side surface.

9. The method for thinning a wafer of claim 1, further comprising:
   providing a carrier comprising a carrier front surface, a carrier back surface disposed opposite to the carrier front surface, and a carrier side surface disposed between the carrier front surface and the carrier back surface, wherein the carrier side surface encompasses the peripheral of the carrier and the carrier front surface is attached onto the active surface of the wafer; and
   when forming the protective structure, simultaneously forming the protective structure on the carrier side surface.

10. The method for thinning a wafer of claim 9, wherein the protective structure comprises a protective side surface and a protective front surface, wherein the protective side surface is corresponding to the side surface and the carrier side surface, the protective front surface is corresponding and substantially parallel to the back surface.

11. The method for thinning a wafer of claim 10, wherein a third angle is disposed between the back surface and the side surface, a fourth angle is disposed between the protective front surface and the protective side surface, wherein the third angle is greater than the fourth angle.

12. The method for thinning a wafer of claim 11, wherein the fourth angle is substantially 90 degrees.

13. The method for thinning a wafer of claim 9, wherein the carrier is another wafer.

14. The method for thinning a wafer of claim 1, wherein the step of forming the protective structure comprises forming a resin on the side surface of the wafer.

15. The method for thinning a wafer of claim 14, wherein the resin includes epoxy resin.

16. The method for thinning a wafer of claim 14, further comprising adding a plurality of particles into the resin, wherein the hardness of the particles is greater than that of the resin.

17. The method for thinning a wafer of claim 16, wherein the particles comprise aluminum oxide, aluminum nitride, silicon oxide or silicon nitride.

18. The method for thinning a wafer of claim 14, further comprising solidifying the resin to form the protective structure.

19. The method for thinning a wafer of claim 18, wherein the step of solidifying the resin comprises using a thermal treatment or a radiance treatment with light energy.

20. A method for thinning a wafer, comprising:
   providing a wafer comprising an active surface, a back surface disposed opposite to the active surface, and a side surface disposed between the active surface and the back surface, wherein the side surface encompasses the peripheral of the wafer;
   forming a protective structure on the wafer, wherein the protective structure only covers the side surface and the side surface is completely covered by the protective structure; and
   performing a thinning process upon the wafer from the back surface.

* * * * *